(12) United States Patent
Ataman et al.

(10) Patent No.: US 7,046,032 B2
(45) Date of Patent: May 16, 2006

(54) ELECTRICAL CONNECTION PLUG FOR REMOTE MONITORING OF HIGH VOLTAGE MOTORS

(75) Inventors: Vedat T. Ataman, Lynchburg, VA (US); Donald V. Ferree, Madison, AL (US); Lew C. McKeague, Forest, VA (US)

(73) Assignee: Framatome Anp, Inc., Lynchburg, VA (US)

( * ) Notice: Subject to any disclaimer, the term of this patent is extended or adjusted under 35 U.S.C. 154(b) by 55 days.

(21) Appl. No.: 10/643,054

(22) Filed: Aug. 18, 2003

(65) Prior Publication Data

US 2005/0040842 A1   Feb. 24, 2005

(51) Int. Cl.
*G05B 23/02* (2006.01)

(52) U.S. Cl. .................. 324/772; 318/565; 388/909
(58) Field of Classification Search ............. 324/772, 324/177; 388/916, 909; 318/454, 565
See application file for complete search history.

(56) References Cited

U.S. PATENT DOCUMENTS

| 5,130,616 | A | * | 7/1992 | Owen ........................... 318/17 |
| 5,223,795 | A | * | 6/1993 | Blades ......................... 324/536 |
| 5,568,033 | A | * | 10/1996 | Brunson ....................... 318/778 |
| 5,923,527 | A | * | 7/1999 | Ricciuti, Jr. ................. 361/641 |
| 6,262,550 | B1 | * | 7/2001 | Kliman et al. ............... 318/565 |
| 2004/0120109 | A1 | * | 6/2004 | Kennedy et al. ............ 361/683 |

\* cited by examiner

*Primary Examiner*—Anjan Deb
*Assistant Examiner*—Marina Kramskaya
(74) *Attorney, Agent, or Firm*—Vytas R. Matas

(57) ABSTRACT

The present invention provides a motor signature measuring system comprising three current transformers which are placed around the power cables leading to the high voltage motor, an E-Plug module connected to the current transformers and located in a motor control case to reduce the motor voltage from 600V RMS to 5V RMS, jack connectors for connecting the 5V output of the module to a connector mounted through the door of the motor control enclosure, and a cable connector for connecting the door connector to a monitoring system conducting the motor signature testing operations.

5 Claims, 3 Drawing Sheets

ELECTRICAL CONNECTION PLUG FOR REMOTE MONITORING OF HIGH VOLTAGE MOTORS

BACKGROUND OF THE INVENTION

1. Field of the Invention

The present invention is generally drawn to remote monitoring devices and more particularly to remote monitoring of high voltage motor parameters.

2. Description of the Prior Art

It is known to have operators acquire motor electrical signal analysis data by connecting probes onto live electrical cables carrying voltages up to 600 volts RMS AC. In this process the operator would open the electrical cabinet door of the cabinet housing the motor control circuitry, connect three clamp-on current transformers and three alligator clips, acquire the data, disconnect the probes, close the door and move to the next motor cabinet to be tested. Thus, the operator constantly reached into potentially lethal voltages twice per motor to be tested. Some plants even refused to permit operators to reach into live cabinets and so no electrical signature analysis data could be obtained. Other plants permitted operators to reach into the cabinet if the operator were properly trained and if the operator wore prohibitively bulky and hot safety gear. This means that some plants which would not permit personnel to acquire motor data for safety reasons were running risks of disastrous failures.

An alternative known method involved acquiring current data only by connecting the current transformers to the power cables just prior to their being routed to or through cable trays or conduits. The same safety problems were found.

Certain other systems for monitoring high voltage motor performance and safety are known as shown in the following US patents.

U.S. Pat. No. 5,571,132 teaches the use of various high voltage motor phase and insulation monitoring systems having a tester connected to the motor power lines through relays to monitor the proper operation of the motor.

U.S. Pat. No. 4,787,244 teaches that it is known to enclose high voltage motor access ports within cases and provide quick connect cables to these motors.

U.S. Pat. No. 4,090,230 teaches that it is known to enclose high voltage motors within cases having external and internal doors for isolating dangerously high voltages from operators.

U.S. Pat. No. 5,652,526 teaches another type of high voltage motor performance testing system.

A review of these patents shows that there is no teaching of using an enclosure for the motor and placing a voltage reducing module neither in the motor case nor of using quick connects on the motor case to safely supply the monitored signals to a remote motor monitoring system to provide much needed safety in monitoring high voltage motors. The patents that do teach motor enclosures and quick connects fail to teach their application to a voltage reduction module in the enclosure and the quick connect internally and externally thereof. These are much needed safety features.

SUMMARY OF THE INVENTION

The present invention solves the mentioned safety problems associated with prior art devices and others by providing an improved system for monitoring the electrical signal analysis data of high voltage motors enclosed within a protective case without subjecting the testing operator to the dangerous motor voltages within the motor case.

The system comprises three current transformers which are placed around the power cables of the three phase high voltage motor within a motor control cabinet, an E-Plug module connected to the current transformers and also located in the motor control cabinet to reduce the motor voltage from 600V RMS to 5V RMS leading to jack connectors for connecting the 5V output of the module to a connector mounted through the door of the motor enclosure, and a cable connector for connecting the door connector to a monitoring system conducting the motor testing operations.

In view of the foregoing it will be seen that one aspect of the present invention is to provide a safe high voltage motor monitoring system.

Another aspect is to provide a low voltage monitoring system for high voltage motors.

Yet another aspect is to provide an easily connected high voltage motor monitoring system.

These and other aspects of the invention will be more fully understood from a review of the following description of the preferred embodiment when reviewed with the accompanying drawings

DESCRIPTION OF THE PREFERRED EMBODIMENT

Figure 1:
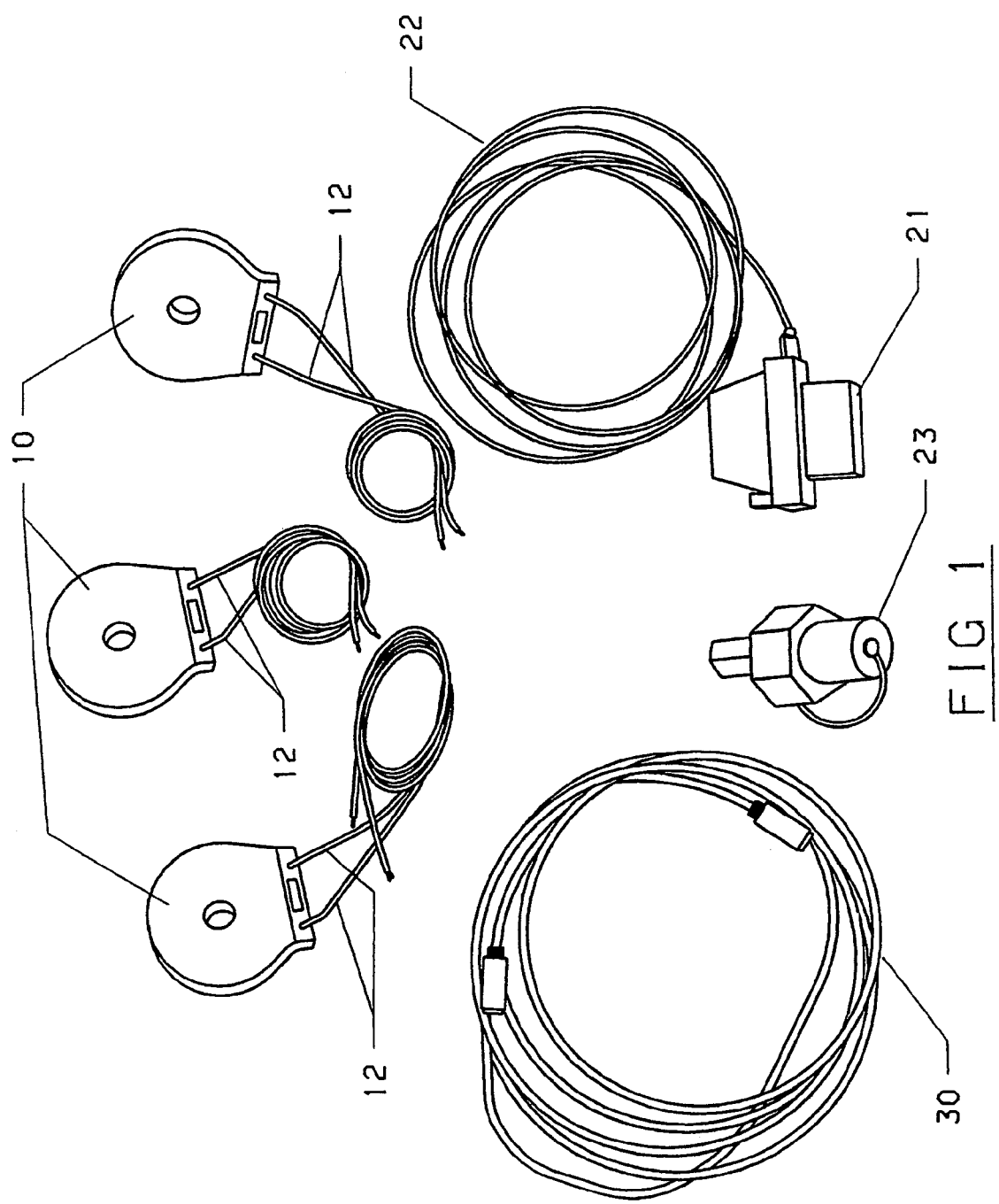
FIG. 1 is a showing of the monitoring system elements of the present invention.
Figure 2:
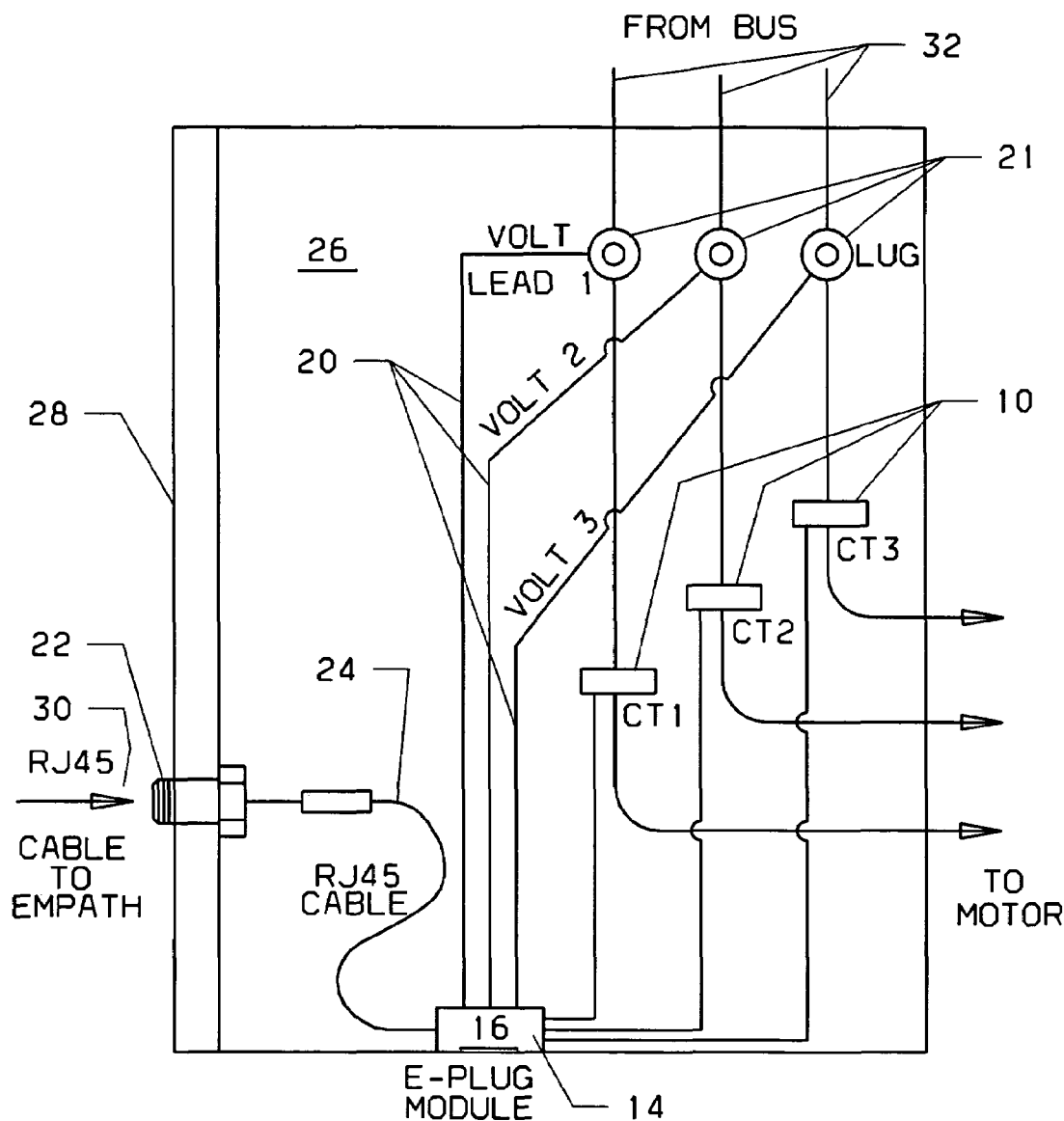
FIG. 2 is a side view of the motor monitoring enclosure with the system elements of FIG. 1 mounted therein.
Figure 3:
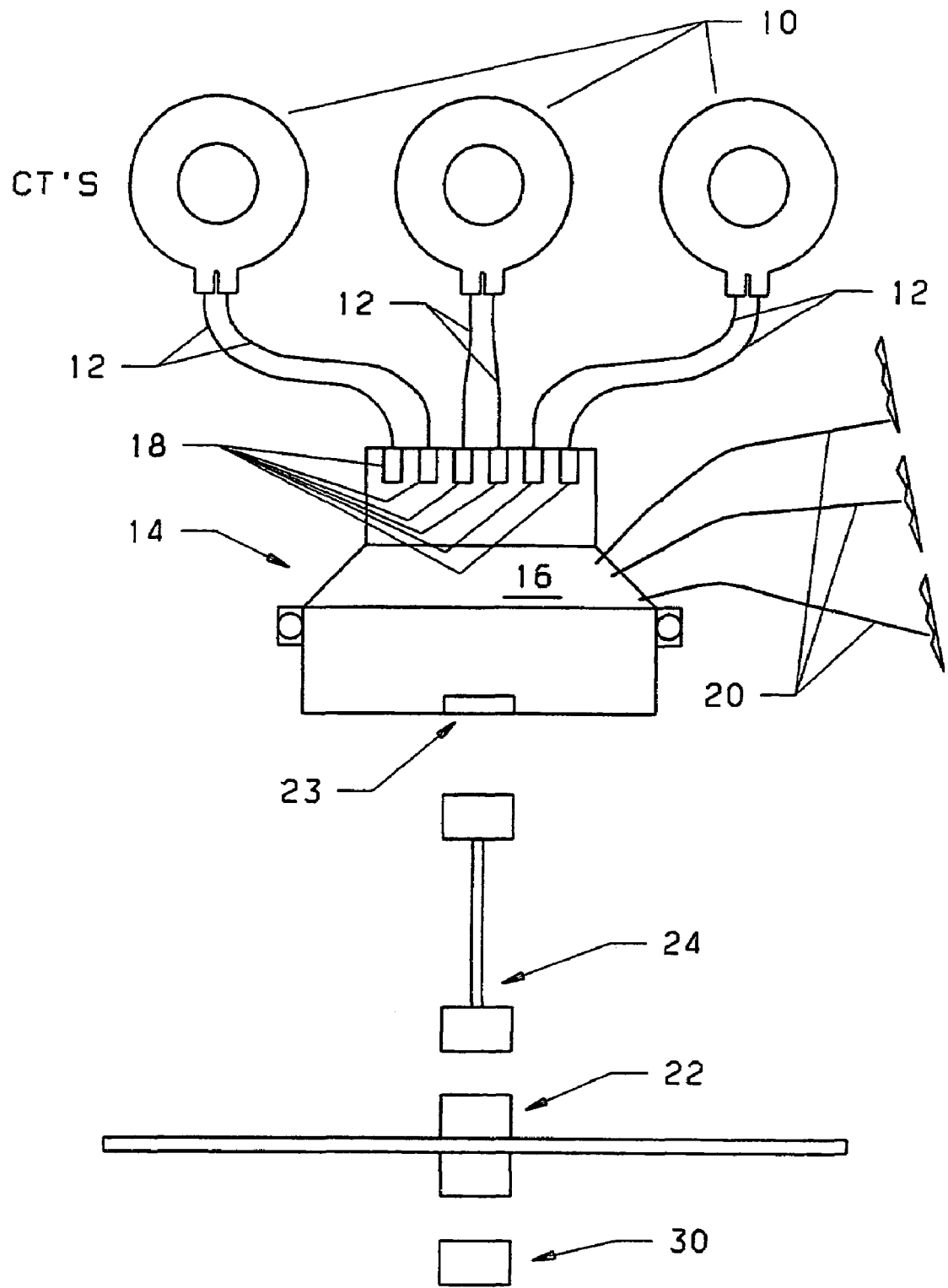
FIG. 3 is a schematic of the system of the present invention.

Referring now to the drawings, the present monitoring system elements are comprised of the following elements.

Three current transformers (10). These current transformers are shaped like donuts with two wires (12) which connect to a module (14) designated as an E-Plug Module. The E-Plug module (14) operating circuitry is enclosed within a plastic housing (16) and has 6 white tabs (18) on a circuit board for the current transformer (10) connections and three voltage wires (20) (black, orange, and blue) to make the motor voltage connections thereto from lugs (21) on the main power lines from the BUS. In addition, this module has a RJ45 plug (23) which connects to a 3 ft. RJ45 modular cable (24) which is a 3 foot green cable used for connecting the E-Plug Module (14) to a thru-door connector (22). The thru-door connector (22) is a black connector that has a RJ45 plug outlet on both ends and also has a lanyard with a screw cap which covers and protects the plug on the outside of the door. This thru-door connector unscrews and fits through a hole that is made in a motor control center cabinet (26) (MCC) having a door (28) and is screwed back together securing this fitting. Note that the hole in the MCC door is made with a standard conduit punch. The 3 ft. RJ45 Module cable (24) snaps into the outlet on the inside of the MCC door (28) and an E-Plug computer cable (30) connects to the outlet on the outside of the MCC door (28) and leads to a known motor signature monitoring system such as the EMPATH or EMPATH 2000 System of Framatome ANP Inc. which provides motor voltage and current analysis.

The above described system elements of the present invention are installed into the motor control center (26) as follows:

Following plant safety practices the MCC (26) is de-energized and the cable for each motor phase is disconnected and the current transformer CT (10) is installed around the phase wire by threading the wire through the hole of the donut shaped transformers (10). The cable is reconnected and energized noting that a. the CT's are installed in the correct sequence (i.e. C1, C2, and C3) and b. all the CT's are installed with the arrow located thereon (not shown) is pointing toward the load.

If necessary wire strippers are used to strip ¼ inch of the insulation off of each CT wire. Next, the white tabs (18) on the E-Plug Module (14) are lifted and the CT wires (12) are inserted into the appropriate slots in the E-Plug Module (i.e. red wire goes to the C1 slot and black wire to C1 Common slot, and likewise for the other two phases). The tabs are then pressed down to lock the wires (12) in place. There are designations (not shown) on the circuit board below the slots to indicate the proper location of these wires. Next using wire strippers, a 1 inch strip of the insulation is removed off of each of the 3 voltage wires (20) colored (blue, orange, and black) coming out of the E-Plug Module and these wires are connected to the connections for each of the 3 phases (i.e. the blue wire to phase 1, orange wire to phase 2, and the black wire to phase 3). The connections are checked to ensure that the voltage and current connections are on the same phases (i.e. CT1 and Voltage 1 are on the same phase, and so on for each phase).

Next, using the E-Plug Module as a template, the location where the E-Plug Module is to be mounted inside the MCC cabinet is identified and using a marker or punch the holes are marked for the mounting bracket. The holes are then drilled with a #41 drill bit (0.096 in dia.) and the E-Plug Module is mounted using (2) 4-40 self tapping screws. Using a drawing which is provided, a hole is cut in the MCC door to mount the Modular Coupler which is inserted from the outside of MCC door. Then one end of the 3 ft Modular Cable is connected to the E-Plug Module and the other end to the Modular Coupler on the inside of the MCC door. All wires are located such that they will not be pinched in the MCC door when it is closed. The MCC door is then closed and the power is turned back on. Now using the EMPATH E-Plug computer cable (30, the black pin connector is connected to the EMPATH computer and then the other end is connected into the Modular Coupler on the outside of the MCC door.

c. Note—if each phase has more than one leg (two or three leads per phase) the CT ratio will have to be multiplied by 2 or 3 to properly scale the data.

E-Plug hardware permits motor electrical signature analysis data to be acquired at the motor control center MCC without opening the MCC door (28). A connector (22) is attached to the door (28) and cabling (24) from the E-Plug module (14) passes low voltage and current data from the probes (10) inside the MCC (26) to the through-door connector (22). The connector (22) mates with a cable (30) that permits direct feed into a monitoring system such as the EMPATH 2000 to expedite electrical signature analysis.

The current and voltage inputs to the E-Plug Module (14) and the current and voltage outputs from the E-Plug module are specified in the following.

The E-Plug Module (14) consists of an enclosure (16) with external attachment leads (10 and 20) to which the motor current and voltage signals are passed. Inside the enclosure (16) electronic circuitry in the module (14) processes the current and voltage signals to prepare them for output to the through-door connector (22).

Power cables (32) to the motor (not shown) are passed through current transducers (CT's) (10) that measure the current flowing through the cable and produce a voltage output proportional to the current following to the motor. The voltage output from the current transducers is typically tens of milli-volts per amp yielding an upper limit of 10 VAC for the current transducer output.

Wires (20) are attached to the power cables to provide a voltage signal to the E-Plug module. For supplied power up to 600 Vrms, the E-Plug module will be directly connected to the voltage signal. For supplied power above 600 Vrms, output from existing potential transformers (PT's) will be used to step the voltage down to 120 Vrms prior to feeding to the E-Plug Module.

For both voltage and current measurements, the frequency response is dc to 5000 Hz, minimum.

The outputs from the E-Plug Module (14) to the MCC through-door connector (22) are 5 Vac peak for both current and voltage. Thus, the voltages at the outside of the MCC door (28) will be limited to 5 Vac peak. All outputs from the E-Plug Module provide frequency response from dc to 5 kHz. The accuracy of all outputs is +/−3%.

In summary, the present motor monitoring systems comprises

Item 1—current transformers (10) three each
Item 2—voltage wire leads (20) three each
Item 3—E-Plug module (14) that includes interface lugs (18) for the wires from the current transformers (10) and from the voltage leads (20). It provides internal circuits to reduce voltage. It provides an RJ-45 connector (23) to a standard RJ-45 cable (24).
Item 4—RJ-45 cable (24)
Item 5—RJ-45 bulkhead connector (22) that goes through the cabinet door.
Item 6—RJ-45 cable (30) to interface with EMPATH or EMPATH 2000 monitoring instrument.

Installation of the E-Plug is performed when the cabinet is de-energized and all connections are made in the cabinet. Once de-energized, the three cables carrying current from the starter to the motor are disconnected and the three current transformers, item 1, are installed by threading the power cables through the current transformers. The leads from the current transformers are attached to the E-Plug module. The three voltage leads are connected to bare power cables on one end and to the E-Plug module on the other. The bulkhead connector is affixed to the cabinet door by punching a hole in the door and attaching the connector, item 22. The cable, item 24 is plugged into the E-Plug module and into the bulkhead connector, item 22. Once installed and the door is shut, all components are unseen inside the cabinet except items 22 and 30 on the outside of the cabinet door.

Advantages of the present Invention are that it will no longer be necessary to open the motor control center door to affix probes to measure current and voltage while the system is operating. Thus it will no longer be necessary to ask an operator to reach into the live electrical cabinet to install probes. An RJ-45 connector on the outside of the door of the cabinet permits the operator to connect a cable to it thereby gaining access to currents and voltages without opening the door.

Alternative materials and elements of the present invention would include different current transformers and the use of transformers to reduce the voltage versus shunt circuits.

Numerous alternate RJ-45 connectors and cables are also available. Thus the present design described for E-Plug system provides the least-cost and best technical alternative for high voltage motor signature measurement.

Certain modifications and details have been deleted herein for the sake of conciseness and readability but are intended to fall within the scope of the following claims.

We claim:

1. A high voltage motor monitoring system comprising:
 a motor control enclosure having high voltage lines extending thereunto from a high voltage source and extending therefrom the power to a high voltage motor;
 a current transformer located on each high voltage line in said motor control enclosure for measuring the current in each high voltage line and producing a low voltage signal proportional to the measured current;
 an E-plug module located inside said motor control enclosure connected to each of said current transformers for processing said low signals there from for use by an eternally located motor monitoring system; and
 a quick connect means mounted on an outside surface of said motor control enclosure having a connection to said E-plug module inside said enclosure and to a motor monitoring system outside said enclosure.

2. A system as set forth in claim 1 wherein said current transformers are donut shaped and have said high voltage lines extending there through.

3. A system as set forth in claim 2 wherein said motor control enclosure has a door thereto and said quick connect means are mounted thereto.

4. A system as set forth in claim 3 wherein said quick connect means includes an RJ-45 plug mounted to said door with a quick connect cable extending from said E-plug module thereto inside said enclosure and a quick connect cable connected thereto outside said enclosure for connection to a motor signature monitoring system.

5. A system as set forth in claim 4 wherein said motor signature monitoring device is an EMPATH type system.

* * * * *